US012690145B2

(12) United States Patent (10) Patent No.: US 12,690,145 B2
Huang et al. (45) Date of Patent: Jul. 21, 2026

(54) PRODUCTION PROCESS OF FLEXIBLE PRINTED CIRCUIT ENCAPSULATION STRUCTURE AND FLEXIBLE PRINTED CIRCUIT ENCAPSULATION STRUCTURE

(71) Applicant: Shenzhen Dancing Future Technology Ltd., Shenzen (CN)

(72) Inventors: Jianhui Huang, Shenzhen (CN); Zhenlong Xie, Shenzhen (CN); Shuisong Liu, Shenzhen (CN)

(73) Assignee: Shenzhen Dancing Future Technology Ltd., Shenzhen (CN)

( * ) Notice: Subject to any disclaimer, the term of this patent is extended or adjusted under 35 U.S.C. 154(b) by 308 days.

(21) Appl. No.: 18/631,956

(22) Filed: Apr. 10, 2024

(65) Prior Publication Data

US 2024/0341045 A1 Oct. 10, 2024

(30) Foreign Application Priority Data

Apr. 10, 2023 (CN) .......................... 202310430171.7

(51) Int. Cl.
    *H05K 5/00* (2025.01)
    *H05K 3/28* (2006.01)
    *H05K 5/02* (2006.01)
(52) U.S. Cl.
    CPC ............. *H05K 5/0034* (2013.01); *H05K 3/28* (2013.01); *H05K 5/02* (2013.01)
(58) Field of Classification Search
    CPC ........... H05K 5/0034; H05K 5/02; H05K 3/28
    (Continued)

(56) References Cited

U.S. PATENT DOCUMENTS

| 5,432,676 A | 7/1995 | Satoh et al. | |
| 2008/0297991 A1* | 12/2008 | Ou ...................... | H04M 1/0235 |
| | | | 361/749 |
| 2011/0255250 A1* | 10/2011 | Dinh ..................... | B32B 17/061 |
| | | | 174/250 |

FOREIGN PATENT DOCUMENTS

| JP | 54-183662 U | 12/1979 |
| JP | 05-259656 A | 10/1993 |

(Continued)

OTHER PUBLICATIONS

Decision to Grant received for Japanese Patent Application No. 2024-062487, mailed on May 13, 2025, 6 pages (3 pages of English Translation and 3 pages of Original Document).

*Primary Examiner* — Andargie M Aychillhum

(74) *Attorney, Agent, or Firm* — Astute IP Law Group

(57) ABSTRACT

The present disclosure provides a production process of a flexible printed circuit encapsulation structure, includes: a FPC overmolding step: processing the FPC board body and the FPC molding tape into an integrated structure to make the FPC board body and the FPC molding tape fit closely each other; a support body assembly step: assembling two connector assemblies on two ends of the elastic support body respectively; a main body assembly step: assembling a combination obtained by the FPC overmolding step and a combination obtained by the support body assembly step; and a soft rubber overmolding step: performing overmolding on an exterior of an overall structure obtained by assembling the FPC plate body, the FPC molding tape, the elastic support body and the two connector assemblies to form the soft rubber jacket. The present disclosure can meet the requirements of larger deformation amplitude, and high deformation frequency.

8 Claims, 4 Drawing Sheets

(58) Field of Classification Search
    USPC ........................................................ 361/749
    See application file for complete search history.

(56)                   References Cited

FOREIGN PATENT DOCUMENTS

JP         2006-164797  A      6/2006
JP         2008-171597  A      7/2008

* cited by examiner

PRODUCTION PROCESS OF FLEXIBLE PRINTED CIRCUIT ENCAPSULATION STRUCTURE AND FLEXIBLE PRINTED CIRCUIT ENCAPSULATION STRUCTURE

CROSS-REFERENCE TO RELATED APPLICATION

This application claims priority to Chinese Patent Application No. 202310430171.7, filed on Apr. 10, 2023, which is hereby incorporated by reference in its entirety.

TECHNICAL FIELD

The present disclosure relates to a production process of a component having a flexible printed circuit, and in particular, a production process of a flexible printed circuit encapsulation structure and a flexible printed circuit encapsulation structure.

BACKGROUND

In the prior art, flexible printed circuit (FPC), as a highly reliable printed circuit board with good flexibility, has the characteristics of high wiring density, light weight, low thickness, and good bending, and especially can be bent, wound, and folded freely and arbitrarily arranged according to the spatial layout requirements, and achieve arbitrary movement and stretching in three-dimensional space. With the explosive growth of wearable devices, flexible displays and intelligent (wearable) devices, there is greatly increased demand for the flexible printed circuit, which is more and more widely used in the industry. However, the bendability of FPC is confined in the traditional direct encapsulation process, and especially for the connection of an encapsulation soft body with large amplitude of back and forth bending or expansion and contraction movements, so that the flexibility and fatigue resistance of its printed circuit copper foil are greatly reduced. Therefore, the FPC is rarely applied in the internal connection of the encapsulation soft body with a large deformation amplitude, and is generally only applied in the hard rubber package without deformation or the flexible structure of the soft rubber package with a small deformation amplitude or a low deformation frequency.

SUMMARY

The technical problem to be solved by the present disclosure is to provide a flexible printed circuit encapsulation structure that can meet a larger deformation amplitude, a high deformation frequency, and other application requirement and a production process thereof in view of the shortcomings of prior art.

To solve the above-mentioned technical problem, the present disclosure adopts the following technical solutions.

There is provided a production process of a flexible printed circuit encapsulation structure, where the flexible printed circuit encapsulation structure includes a FPC board body, a FPC molding tape, an elastic support body, two connector assemblies and a soft rubber jacket. The production process includes: a FPC overmolding step: processing the FPC board body and the FPC molding tape into an integrated structure to make the FPC board body and the FPC molding tape fit closely each other; a support body assembly step: assembling the two connector assemblies on two ends of the elastic support body respectively; a main body assembly step: assembling a combination obtained by the FPC overmolding step and a combination obtained by the support body assembly step; and a soft rubber overmolding step: performing overmolding on an exterior of an overall structure obtained by assembling the FPC plate body, the FPC molding tape, the elastic support body and the two connector assemblies to form the soft rubber jacket.

Preferably, in a preparation step, a mold forming process for processing the FPC board body and the FPC molding tape into an integrated structure includes a vacuum cast-molding, a mold injection or a mold hot pressing.

Preferably, the connector assembly includes a functional shell body and an inner connector, the inner connector is embedded in the functional shell body, and the functional shell body and the inner connector are formed by processing with an encapsulation process.

There is provided a flexible printed circuit encapsulation structure, including a FPC board body, a FPC molding tape, an elastic support body, two connector assemblies and a soft rubber jacket, where the two connector assemblies are respectively located inside left and right ends of the soft rubber jacket; the FPC plate body, the FPC molding tape and the elastic support body are each disposed inside the soft rubber jacket; two ends of the FPC board body respectively extend through and outward from two connector assemblies; left ends of the elastic support body and the FPC molding tape and their right ends are correspondingly fixed to two connector assemblies, respectively; the FPC board body and the FPC molding tape are closely fitted to be an integrated structure; and an area of the FPC board body for fitting to the FPC molding tape is provided with a deformation part having multiple bends.

Preferably, the deformation part is in a form of wave having an S-shaped bending, a triangle-shaped bending, a square-shaped bending, a V-shaped bending or a trapezoid-shaped bending.

Preferably, the deformation part is in a form of spiral having a spiral column-shaped bending, a spiral cone-shaped bending or a spiral spindle-shaped bending.

Preferably, a side of the FPC molding tape facing the FPC board body is provided with an attachment part, a surface shape of the attachment part is the same as a bending shape of the deformation part, and the attachment part is fitted to the deformation part.

Preferably, the connector assembly includes a functional shell body and an inner connector, and the inner connector is embedded in the functional shell body.

Preferably, left and right ends of the FPC molding tape are respectively formed with plug blocks, and two plug blocks are respectively plugged into two inner connectors.

Preferably, a slit is formed at a junction of the plug block and the FPC molding tape, and the FPC board body passes through the slit.

In the flexible printed circuit encapsulation structure and the production process thereof, the left and right ends of the soft rubber jacket are respectively embedded with the connector assemblies, and meanwhile the FPC board body, the FPC molding tape and the elastic support body are disposed inside the soft rubber jacket. On the basis of this, the present disclosure employs a mold forming process to process the FPC board body and FPC molding tape to be an integrated structure. While ensuring the close fit between the FPC board body and the FPC molding tape, an area of the FPC board body for fitting to the FPC molding tape is formed with the deformation part having multiple bends. Under the action of the deformation part having multiple bends, when the soft rubber jacket and the internal component thereof are twisted, bent, crimped, extended, compressed and other operations as a whole, it is possible to not only meet the requirement of large amplitude deformation and but also have high frequency deformation capability, thereby being applicable for various types of products such as wearable devices, flexible display devices and intelligent terminal devices.

DESCRIPTION OF EMBODIMENTS

Figure 1:
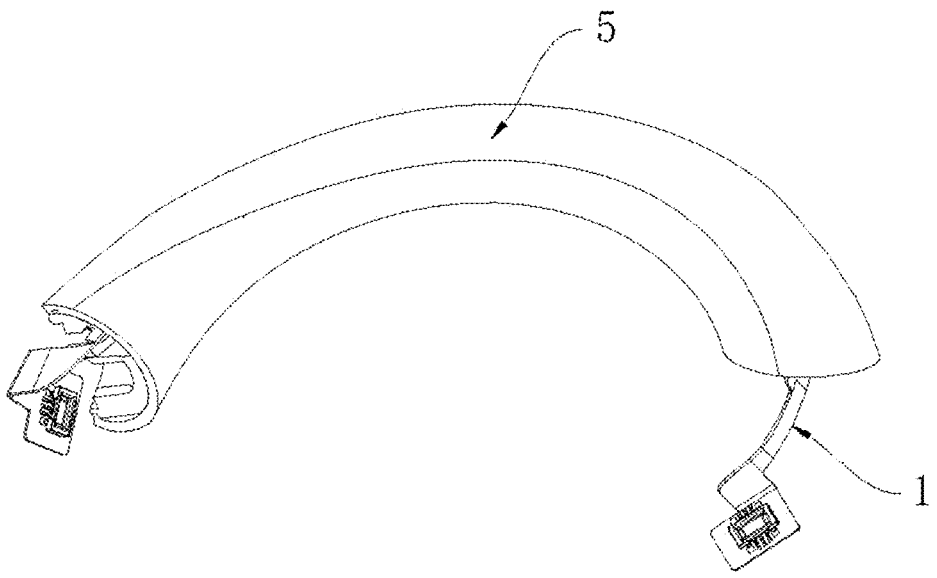
FIG. 1 is a stereogram I after assembling of a flexible printed circuit encapsulation structure.
Figure 2:
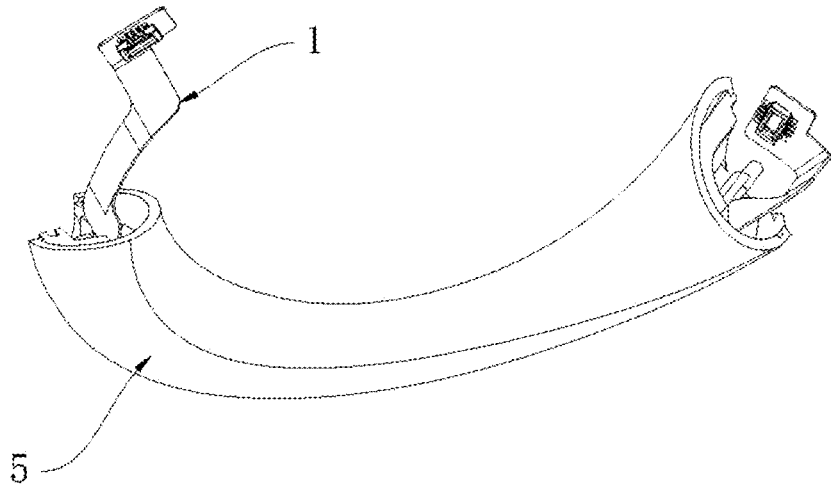
FIG. 2 is a stereogram II after assembling of the flexible printed circuit encapsulation structure.
Figure 3:
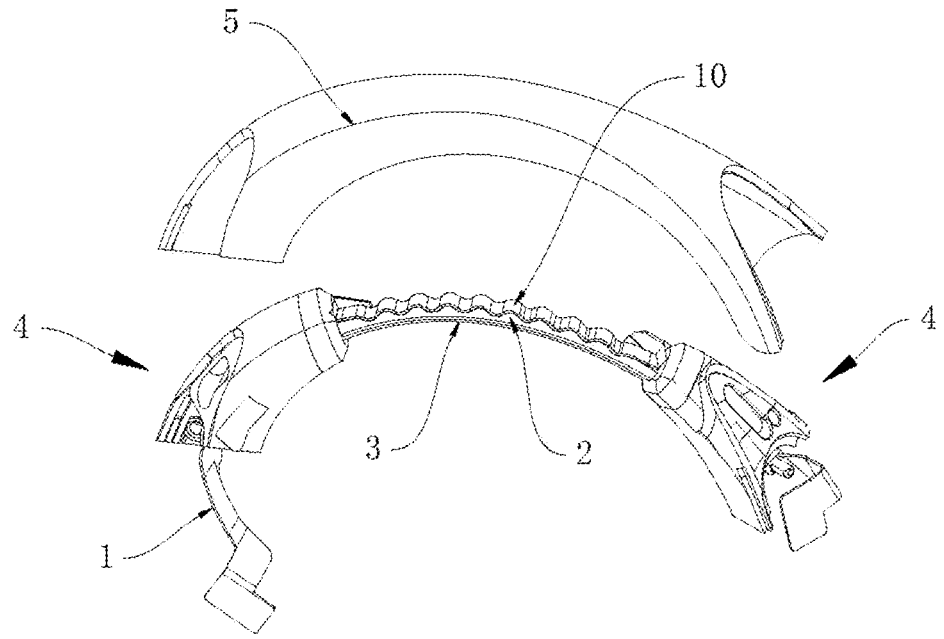
FIG. 3 is a partial exploded view I of the flexible printed circuit encapsulation structure.
Figure 4:
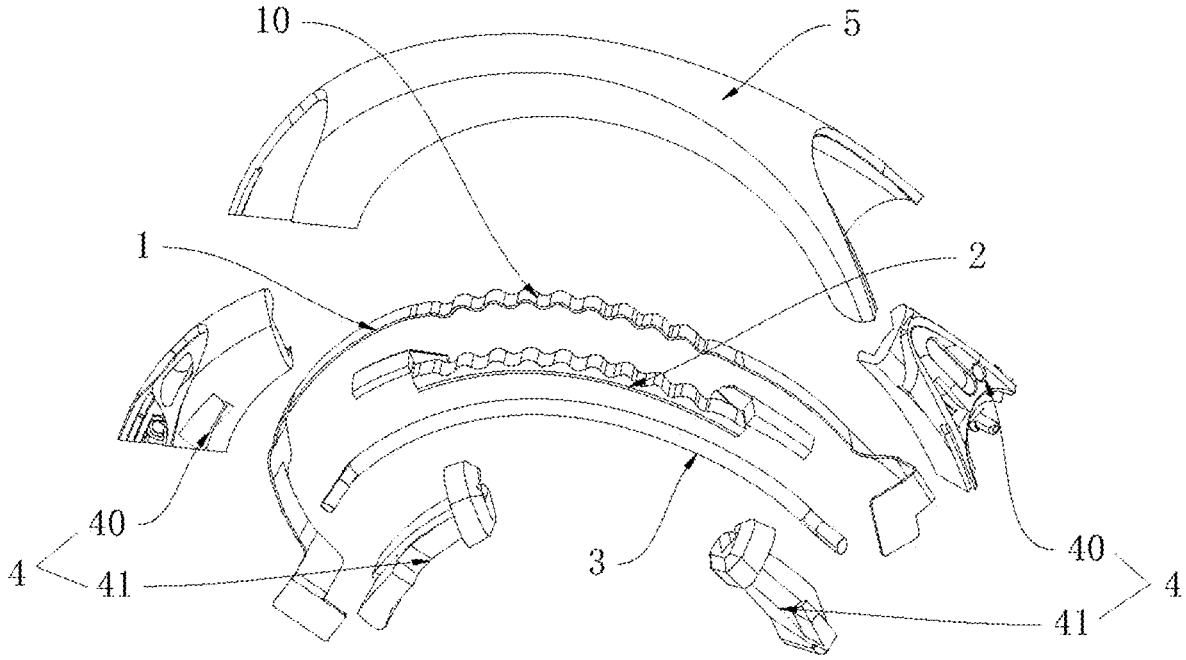
FIG. 4 is an exploded view of the flexible printed circuit encapsulation structure.

The present disclosure will be described below in more detail in conjunction with the accompanying drawings and embodiments.

The present disclosure discloses a production process of a flexible printed circuit encapsulation structure. As shown in FIG. 1 to FIG. 8, the flexible printed circuit encapsulation structure includes a FPC board body 1, a FPC molding tape 2, an elastic support body 3, two connector assemblies 4 and a soft rubber jacket 5; and the production process includes:
    a FPC overmolding step: processing the FPC board body 1 and the FPC molding tape 2 into an integrated structure to make the FPC board body 1 and the FPC molding tape 2 fit closely each other;
    a support body assembly step: assembling the two connector assemblies 4 on two ends of the elastic support body 3 respectively;
    a main body assembly step: assembling a combination obtained by the FPC overmolding step and a combination obtained by the support body assembly step; and
    a soft rubber overmolding step: performing overmolding on an exterior of the overall structure obtained by assembling the FPC board body 1, the FPC molding tape 2, the elastic support body 3 and two connector assemblies 4 to form the soft rubber jacket 5.

In the flow chart of above-mentioned process, the left and right ends of the soft rubber jacket 5 are respectively embedded with the connector assemblies 4, and meanwhile the FPC board body 1, the FPC molding tape 2 and the elastic support body 3 are disposed inside the soft rubber jacket 5. On the basis of this, the present disclosure uses a mold forming process to process the FPC board body 1 and FPC molding tape 2 to be an integrated structure. While ensuring the close fit between the FPC board body 1 and the FPC molding tape 2, an area of the FPC board body 1 for fitting to the FPC molding tape 2 is formed with a deformation part 10 having multiple bends. Under the action of the deformation part 10 that bends many times, when the soft rubber jacket 5 and the internal component thereof are twisted, bent, crimped, extended, compressed and other operations as a whole, it is possible to not only meet the requirement of large amplitude deformation and but also have high frequency deformation capability, thereby being suitable for various types of products such as wearable devices, flexible display devices and intelligent terminal devices.

As a preferred implementation, in a preparation step, a mold forming process of processing the FPC board body 1 and the FPC molding tape 2 to be an integrated structure includes a vacuum cast-molding, a mold injection or a mold hot pressing. Compared with manual bending molding or mold cold-extrusion molding used in the prior art, the present embodiment can ensure the stability of the FPC molding tape 2 after shaping, and then maintain the uniform distribution of stress borne by the FPC board body 1 during the deformation.

Further, the connector assembly 4 includes a functional shell body 40 and an inner connector 41, the inner connector 41 is embedded in the functional shell body 40, and the functional shell body 40 and the inner connector 41 are formed by the encapsulation process. Specifically, in this step, the assembly process of the functional shell body 40 and the inner connector 41 includes glue connection, mold overmolding, ultrasonic welding, screw fixing, etc.

The present embodiment also relates to a flexible printed circuit encapsulation structure, as shown in FIG. 1 to FIG. 7, including the FPC board body 1, the FPC molding tape 2, the elastic support body 3, two connector assemblies 4 and the soft rubber jacket 5. The two connector assemblies 4 are respectively located inside left and right ends of the soft rubber jacket 5. The FPC board body 1, the FPC molding tape 2 and the elastic support body 3 are each disposed inside the soft rubber jacket 5; and two ends of the FPC board body 1 respectively extend through and outward from two connector assemblies 4. Left ends of the elastic support body 3 and the FPC molding tape 2 and their right ends are correspondingly fixed to two connector assemblies 4, respectively. The FPC board body 1 and the FPC molding tape 2 are closely fitted to be an integrated structure, and an area of the FPC board body 1 fitting to the FPC molding tape 2 is provided with a deformation part 10 having multiple bends.

The deformation part 10 of the FPC board body 1 may have a variety of bending forms, for example, the deformation part 10 is in a form of wave having an S-shaped bending, a triangle-shaped bending, a square-shaped bending, a V-shaped bending or a trapezoid-shaped bending. Or, the deformation part 10 is in a form of spiral having a spiral column shaped-bending, a spiral cone shaped-bending or a spiral spindle-shaped bending. However, this is only used as a preferred application example of the present disclosure and is not used to limit the protection scope of the present disclosure. According to the design needs, it can also be designed as other structures with periodic deformation or irregular bending.

In practical application, after the completion of processing the FPC molding tape 2 by the mold forming process, an attachment part 20 will be formed. Specifically, a side of the FPC molding tape 2 facing the FPC board body 1 is provided with an attachment part 20, and a surface shape of the attachment part 20 is the same as a bending shape of the deformation part 10. The attachment part 20 is fitted to the deformation part 10.

In the present embodiment, the connector assembly 4 includes a functional shell body 40 and an inner connector 41, and the inner connector 41 is embedded in the functional shell body 40.

Figure 5:
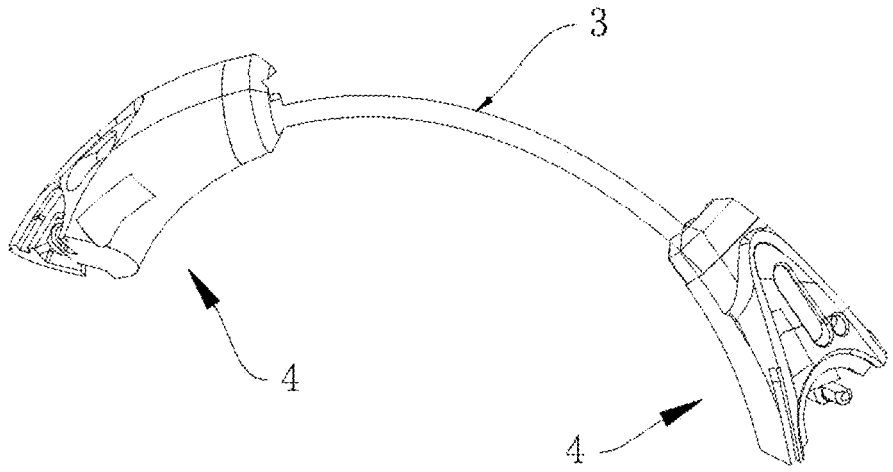
FIG. 5 is structural diagram of an elastic support body and two connector assemblies.
Figure 6:
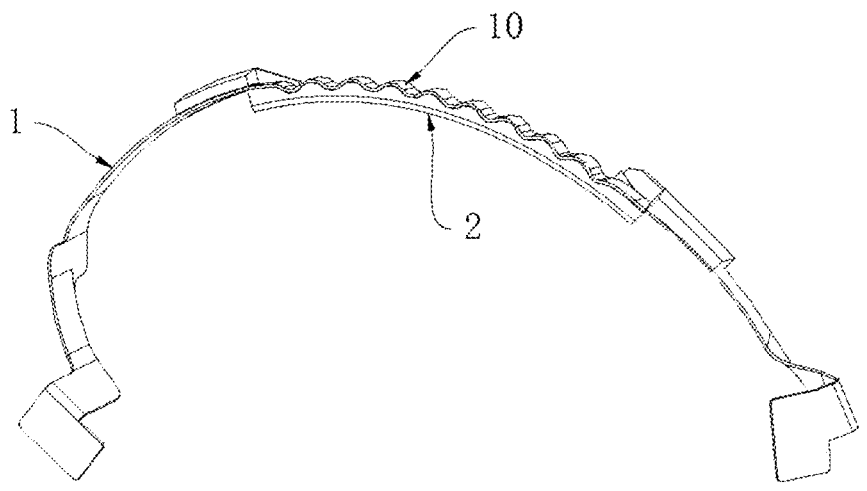
FIG. 6 is a stereoscopic view after processing of a FPC board body and a FPC molding tape into an integrated structure.
Figure 7:
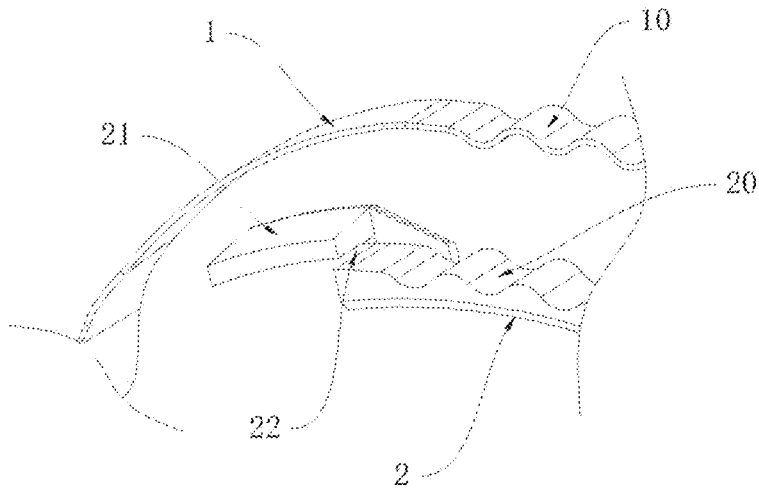
FIG. 7 is a partial exploded view II of the flexible printed circuit encapsulation structure.
Figure 8:
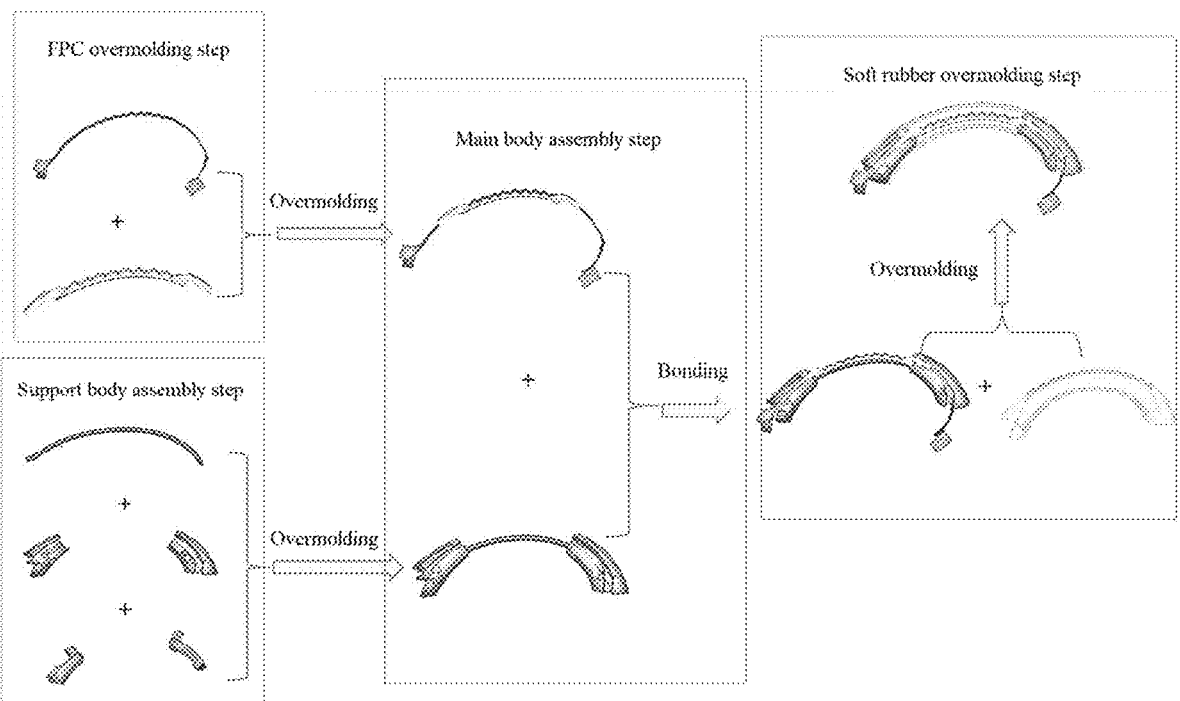
FIG. 8 is a flow chart of a production process of the flexible printed circuit encapsulation structure of the present disclosure.

Referring to FIG. 5, when the elastic support body 3 is fixed between two connector assemblies 4, two ends of the elastic support body 3 are respectively plugged into two inner connectors 41. In practical application, a cross section of the elastic support body 3 is preferably circular, rectangular, triangular or polygonal; and its material may be a variety of metals (for example, iron bar, steel bar, spring steel, Nitinol alloy, etc.), or various engineering plastic materials (for example, polycarbonate (PC), acrylonitrile butadiene styrene (ABS), polypropylene (PP), polyamide (PA), etc.). In practical application, a stretch shape of the elastic support body 3 can be adjusted and set appropriately according to needs, which is not limited to the arc shown in the figure.

In order to better fix the FPC molding tape 2, in the present embodiment, left and right ends of the FPC molding tape 2 are respectively provided with plug blocks 21, and the two plug blocks 21 are respectively plugged into two inner connectors 41.

As a preferred implementation, a slit 22 is formed at a junction of the plug block 21 and the FPC molding tape 2, and the FPC board body 1 passes through the slit 22 to strengthen the fit relationship between the FPC board body 1 and the FPC molding tape 2.

In this embodiment, an encapsulation material of the soft rubber jacket 5 and the FPC molding tape 2 are each of two-part structure, and various combinations of the different hardness material or color combinations can be obtained by adjusting different materials, hardness or colors of the two parts.

In a preferred embodiment of the present disclosure, a hardness of the soft rubber jacket 5 is preferably greater than or equal to a hardness of the FPC molding tape 2. Specifically, the FPC molding tape 2 requires a smaller hardness and a softer texture, while the soft rubber jacket 5 may have a slightly smaller or larger hardness, thereby improving expansibility of the product and enriching various manifestations of the product to meet the application requirements in different scenarios.

The above-mentioned are only better embodiments of the present disclosure and are not intended to limit the present disclosure. Any modification, equivalent substitution or improvement made within the technical scope of the present disclosure shall be included in the protection scope of the present disclosure.

What is claimed is:

1. A production process of a flexible printed circuit encapsulation structure, wherein the flexible printed circuit encapsulation structure comprises a FPC board body, a FPC molding tape, an elastic support body, two connector assemblies and a soft rubber jacket; and the production process comprises: a FPC over molding step: processing the FPC board body and the FPC molding tape into an integrated structure to make the FPC board body and the FPC molding tape fit closely each other; a support body assembly step: assembling the two connector assemblies on two ends of the elastic support body respectively; a main body assembly step: assembling a combination obtained by the FPC over molding step and a combination obtained by the support body assembly step; and a soft rubber over molding step: performing over molding on an exterior of an overall structure obtained by assembling the FPC board body, the FPC molding tape, the elastic support body and two connector assemblies to form the soft rubber jacket, wherein each connector assembly comprises a functional shell body and an inner connector; the inner connector is embedded in the functional shell body; and the functional shell body and the inner connector are formed by processing with an encapsulation process.

2. The production process of a flexible printed circuit encapsulation structure according to claim 1, wherein in a preparation step, a mold forming process of processing the FPC board body and the FPC molding tape into an integrated structure comprises a vacuum cast-molding, a mold injection or a mold hot pressing.

3. A flexible printed circuit encapsulation structure, comprising: a FPC board body, a FPC molding tape, an elastic support body, two connector assemblies and a soft rubber jacket, wherein the two connector assemblies are respectively located inside left and right ends of the soft rubber jacket; and the FPC board body, the FPC molding tape and the elastic support body are each disposed inside the soft rubber jacket; two ends of the FPC board body respectively extend through and outward from the two connector assemblies; left ends of the elastic support body and the FPC molding tape and their right ends are correspondingly fixed to the two connector assemblies, respectively; the FPC board body and the FPC molding tape are closely fitted to be an integrated structure; and an area of the FPC board body for fitting to the FPC molding tape is provided with a deformation part having multiple bends, wherein each connector assembly comprises a functional shell body and an inner connector, and the inner connector is embedded in the functional shell body.

4. The flexible printed circuit encapsulation structure according to claim 3, wherein the deformation part is in a form of wave having an S-shaped bending, a triangle-shaped bending, a square-shaped bending, a V-shaped bending or a trapezoid-shaped bending; or the deformation part is in a form of spiral having a spiral column-shaped bending, a spiral cone shaped-bending or a spiral spindle-shaped bending.

5. The flexible printed circuit encapsulation structure according to claim 3, wherein a hardness of the soft rubber jacket is greater than or equal to a hardness of the FPC molding tape.

6. The flexible printed circuit encapsulation structure according to claim 3, wherein a side of the FPC molding tape facing the FPC board body is provided with an attachment part, a surface shape of the attachment part is the same as a bending shape of the deformation part, and the attachment part is fitted to the deformation part.

7. The flexible printed circuit encapsulation structure according to claim 3, wherein left and right ends of the FPC molding tape are respectively provided with plug blocks, and two plug blocks are respectively plugged into the two inner connectors.

8. The flexible printed circuit encapsulation structure according to claim 7, wherein a slit is formed at a junction of the plug block and the FPC molding tape, and the FPC board body passes through the slit.

* * * * *